(12) United States Patent
Ngo et al.

(10) Patent No.: US 7,704,878 B2
(45) Date of Patent: Apr. 27, 2010

(54) CONTACT SPACER FORMATION USING ATOMIC LAYER DEPOSITION

(75) Inventors: Minh Van Ngo, Fremont, CA (US); Angela T. Hui, Fremont, CA (US); Amol Ramesh Joshi, Sunnyvale, CA (US); Wenmei Li, Sunnyvale, CA (US); Ning Cheng, San Jose, CA (US); Ankur Bhushan Agarwal, San Jose, CA (US); Norimitsu Takagi, Sunnyvale, CA (US)

(73) Assignees: Advanced Micro Devices, Inc.,, Sunnyvale, CA (US); Spansion LLC, Sunnyvale, CA (US)

( * ) Notice: Subject to any disclaimer, the term of this patent is extended or adjusted under 35 U.S.C. 154(b) by 751 days.

(21) Appl. No.: 11/240,468

(22) Filed: Oct. 3, 2005

(65) Prior Publication Data

US 2007/0077754 A1    Apr. 5, 2007

(51) Int. Cl.
*H01L 21/4763* (2006.01)
(52) U.S. Cl. .............. 438/643; 257/E21.585; 438/597
(58) Field of Classification Search .............. 438/639, 438/597, 643; 257/E21.585
See application file for complete search history.

(56) References Cited

U.S. PATENT DOCUMENTS

| | | | |
|---|---|---|---|
| 6,235,633 B1 * | 5/2001 | Jang | 438/675 |
| 6,911,382 B2 * | 6/2005 | Jung et al. | 438/533 |
| 2002/0117399 A1 | 8/2002 | Chen et al. | |
| 2002/0155726 A1 | 10/2002 | Ueda | |
| 2003/0109107 A1 * | 6/2003 | Hsieh et al. | 438/303 |
| 2003/0127427 A1 | 7/2003 | Yuan et al. | |
| 2003/0181015 A1 * | 9/2003 | Komatsu | 438/303 |
| 2004/0092095 A1 | 5/2004 | Nguyen et al. | |
| 2004/0178505 A1 | 9/2004 | Park et al. | |
| 2005/0048765 A1 | 3/2005 | Kim | |
| 2006/0292775 A1 * | 12/2006 | Hsu et al. | 438/197 |

OTHER PUBLICATIONS

International Search Report for PCT/US2006/037518 Mailed Nov. 24, 2006.

\* cited by examiner

*Primary Examiner*—Asok K Sarkar
(74) *Attorney, Agent, or Firm*—Harrity & Harrity, LLP

(57) ABSTRACT

A contact structure in a semiconductor device includes a layer of dielectric material and a via formed through the dielectric material. The contact structure further includes a spacer formed on sidewalls of the via using atomic layer deposition (ALD) and a metal deposited in the via.

22 Claims, 11 Drawing Sheets

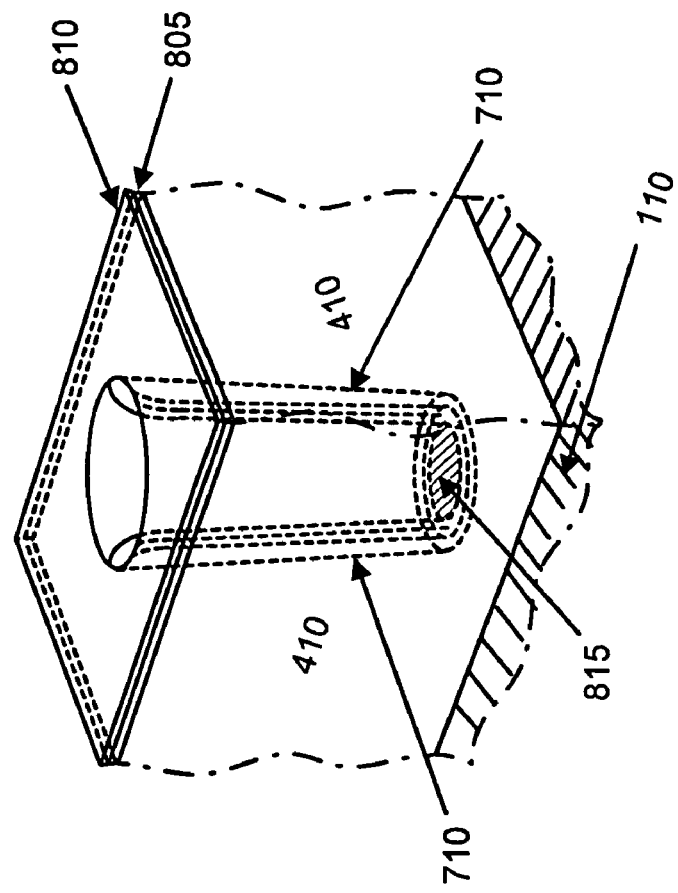
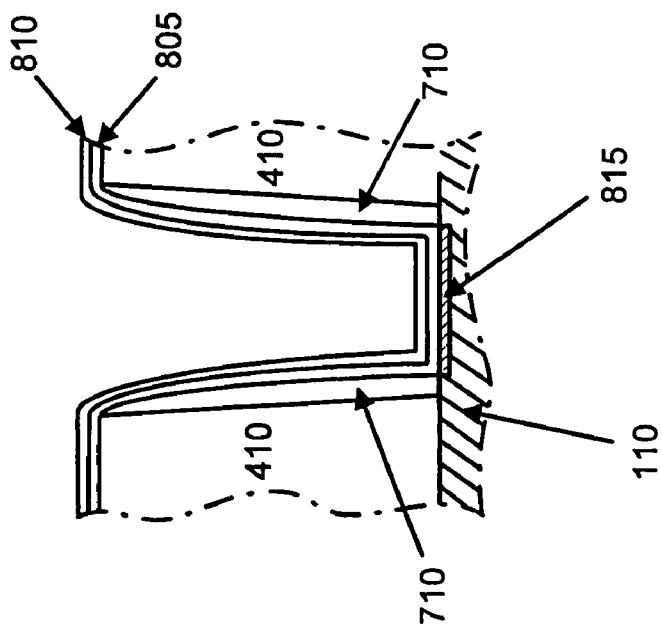
FIG. 8B
FIG. 8A

CONTACT SPACER FORMATION USING ATOMIC LAYER DEPOSITION

TECHNICAL FIELD

The present invention relates generally to semiconductor devices and, more particularly, to creating contacts in semiconductor devices.

BACKGROUND ART

In many existing semiconductor devices, interlayer dielectrics (ILDs) are formed between different layers of conductors. Subsequent to formation of an ILD, various processes may be performed to complete the formation of the semiconductor device(s). For example, one process includes etching an ILD (e.g., ILD0) to create a via for a contact between the semiconductor devices, or between conductors that interconnect various conductive structures in a semiconductor device. Creation of a contact typically involves etching the ILD to create the via, forming a spacer on the walls of the via, and filling the via with a metal. The spacer formed within the via typically includes silicon nitride, and is deposited using a low-pressure chemical vapor deposition (LPCVD) process. The high temperatures involved in LPCVD (e.g., 760 degrees C. or more), however, may cause "re-flow" of the ILD layer (e.g., ILD0), that may include a boro-phosphosilicate glass (BPSG) material, resulting in undesirable deformation (e.g., tilting) of the contact. The high temperatures involved in LPCVD of the contact spacer may also increase roughness of, for example, cobalt silicon (CoSi) in source/drain regions of the semiconductor device, thus, resulting in increased current leakage associated with the completed contact, such as, for example, at an interface of CoSi and silicon.

DISCLOSURE OF THE INVENTION

Consistent with aspects of the invention, an atomic layer deposition (ALD) process, instead of a LPCVD process, may be used to form a contact spacer. After creation of a via in the ILD, an ALD process may be used to form a layer of material, such as, for example, silicon nitride, that can then be etched to produce the contact spacer. The ALD process uses a lower temperature than a LPCVD process and, thus, decreases deformation of the contact that results from "re-flow" of the ILD layer (e.g., the ILD0 layer). Subsequent to formation of the contact spacer, a barrier metal layer may be formed over the contact spacer and the contact may be formed over the barrier metal layer within the via.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming a contact. The method may include forming a via through a dielectric material and using atomic layer deposition (ALD) to form a spacer on sidewalls of the via. The method may also include forming a barrier layer adjacent the spacer and forming a contact adjacent the barrier layer.

According to another aspect of the invention, a method may include forming a spacer within a via using atomic layer deposition (ALD). The method may further include forming a contact adjacent the spacer within the via According to a further aspect of the invention, a contact structure in a semiconductor device may include a layer of dielectric material and a via formed through the dielectric material. The contact structure may further include a spacer formed on sidewalls of the via using atomic layer deposition (ALD), a barrier layer formed adjacent the spacer, and a metal formed adjacent the barrier layer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 8A & 8B illustrate the formation of metal layers over the spacer of FIGS. 7A & 7B consistent with an aspect of the invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
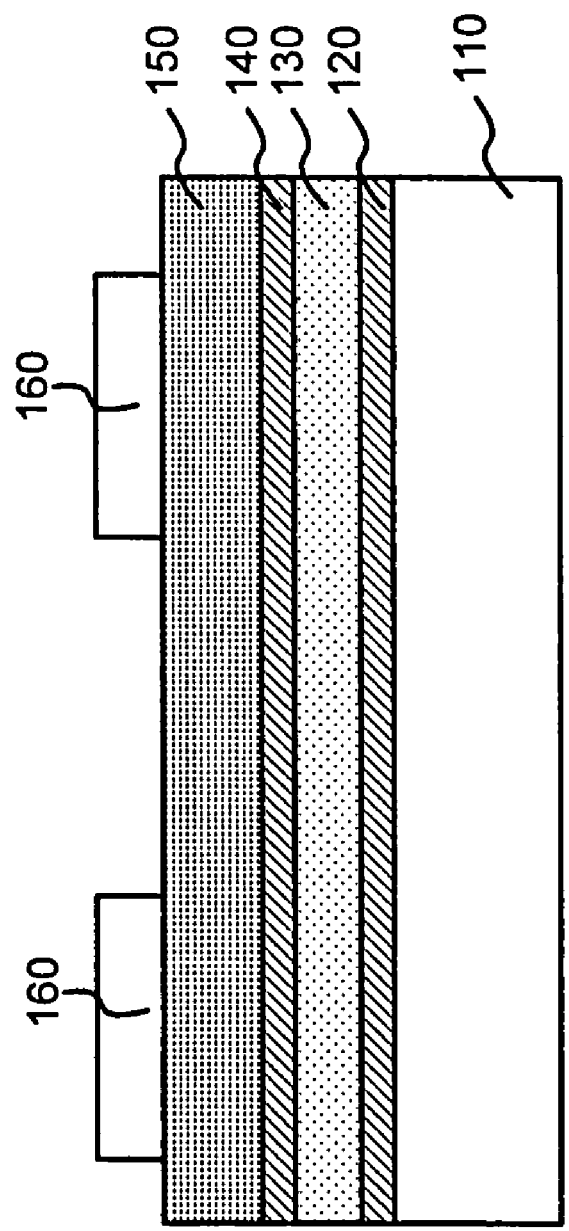
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), a high K hafnium oxide, or an alumina oxide, and may have a thickness ranging from about 20 Å to about 120 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride). Layer 130, consistent with the invention, may act as a charge storage layer for semiconductor device 100 and may have a thickness ranging from about 20 Å to about 120 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., $SiO_2$). Alternatively, layer 140 may include another dielectric material, such as a silicon oxynitride, that may be deposited or thermally grown on layer 130. In still other alternatives, layer 140 may be a composite that includes a number of dielectric layers or films. Layer 140 may have a thickness ranging from about 20 Å to about 120 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from about 800 Å to about 2500 Å. An optional silicide layer, such as titanium silicide (not shown) may be formed on layer 150.

A photoresist material may be patterned and etched to form masks 160 on the top surface of layer 150, as illustrated in FIG. 1. Masks 160 may be used to facilitate formation of one or memory cells in semiconductor device 100, as described in more detail below.

Figure 2:
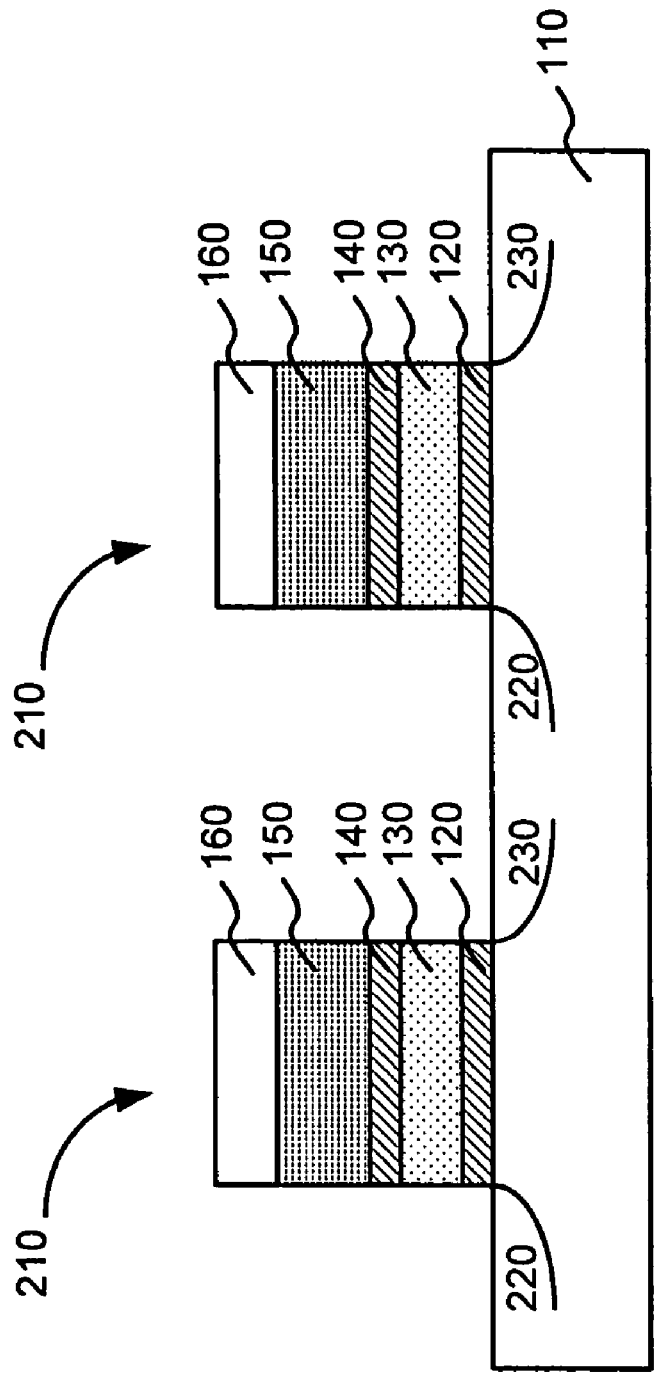
FIG. 2 is a cross-section illustrating the formation of memory cells in accordance with an embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. Alternatively, the etching may terminate at another layer, such as layer 140, followed in some implementations by additional etching to form structures 210. Each structure 210 (also referred to herein as a memory cell 210) may represent a memory cell of semiconductor device 100, where each memory cell 210 includes a dielectric layer 120, a charge storage layer 130, an inter-gate dielectric layer 140 and a control gate electrode 150. Only two memory cells 210 are illustrated in semiconductor device 100 in FIG. 2 for simplicity. It should be understood that semiconductor device 100 may typically include a memory array including a large number of memory cells 210.

In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110.

Source and drain regions 220 and 230 may then be formed in substrate 110, as illustrated in FIG. 2. For example, n-type or p-type impurities may be implanted in substrate 110 to form source and drain regions 220 and 230, based on the particular end device requirements. In one implementation, an n-type dopant, such as phosphorous or arsenic, may be implanted at a dosage ranging from about $2 \times 10^{13}$ atoms/$cm^2$ to about $4 \times 10^{15}$ atoms/$cm^2$ and an implantation energy ranging from about 2 KeV to about 60 KeV. Alternatively, a p-type dopant, such as boron, may be implanted at similar dosages and implantation energies. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
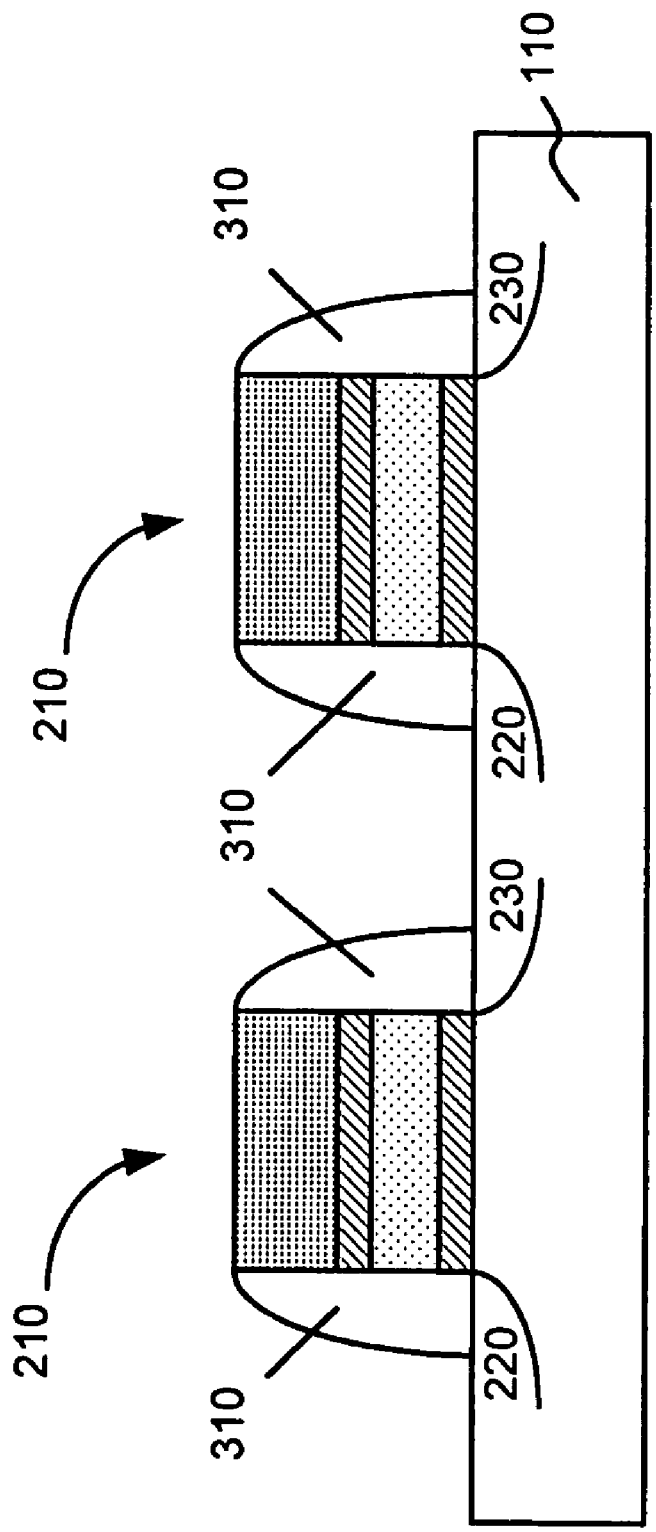
FIG. 3 is a cross-section illustrating the formation of spacers on the memory cells of FIG. 2 in accordance with an embodiment of the invention.

Photoresist masks 160 may be removed using a conventional process. Spacers 310 may be formed adjacent the sidewalls of the memory cells 210, as illustrated in FIG. 3. For example, a dielectric material, such as a silicon oxide, a silicon oxynitride or another dielectric material, may be deposited and etched to form spacers 310 on each side of memory cells 210. Spacers 310 may be used to electrically isolate adjacent memory cells 210 from each other. Spacers 310 may also be used to facilitate the deposition of impurities in semiconductor device 100.

In an exemplary implementation consistent with the invention, each of memory cells 210 illustrated in FIG. 3 may be configured to store two bits of data. That is, charge storage layer 130 may be programmed to store two separate bits of data by localizing the first and second charges to the respective left and right sides of charge storage layer 130 illustrated in FIG. 3. For example, each of the two bits of memory cell 210 may be programmed independently by, for example, channel hot electron injection, to store a bit on each respective side of the charge storage layer 130. In this manner, the charges in charge storage layer 130 become effectively trapped on each respective side of charge storage layer 130. Erasing of each bit in memory cell 210 may also be performed independently. During erasing, hot holes are ejected to the storage layer to neutralize the previous electron charge (hot hole erase). Also the bits stored in charge storage layer 130 may tunnel through dielectric layer 120 into the source region 220 and drain region 230 by Fowler-Nordheim (FN) tunneling, respectively.

In this manner, the density of the array of memory cells 210 in semiconductor device 100 may be increased as compared to conventional memory devices that store only one bit of data per cell. In alternative implementations, each memory cell 210 may be configured to store one bit of data per memory cell 210. In addition, in alternative implementations, semiconductor device 100 may be a floating gate memory device in which layer 130 is formed from a conductive material, such as polysilicon, and functions as a charge storage element for each memory cell 210.

Figure 4A:
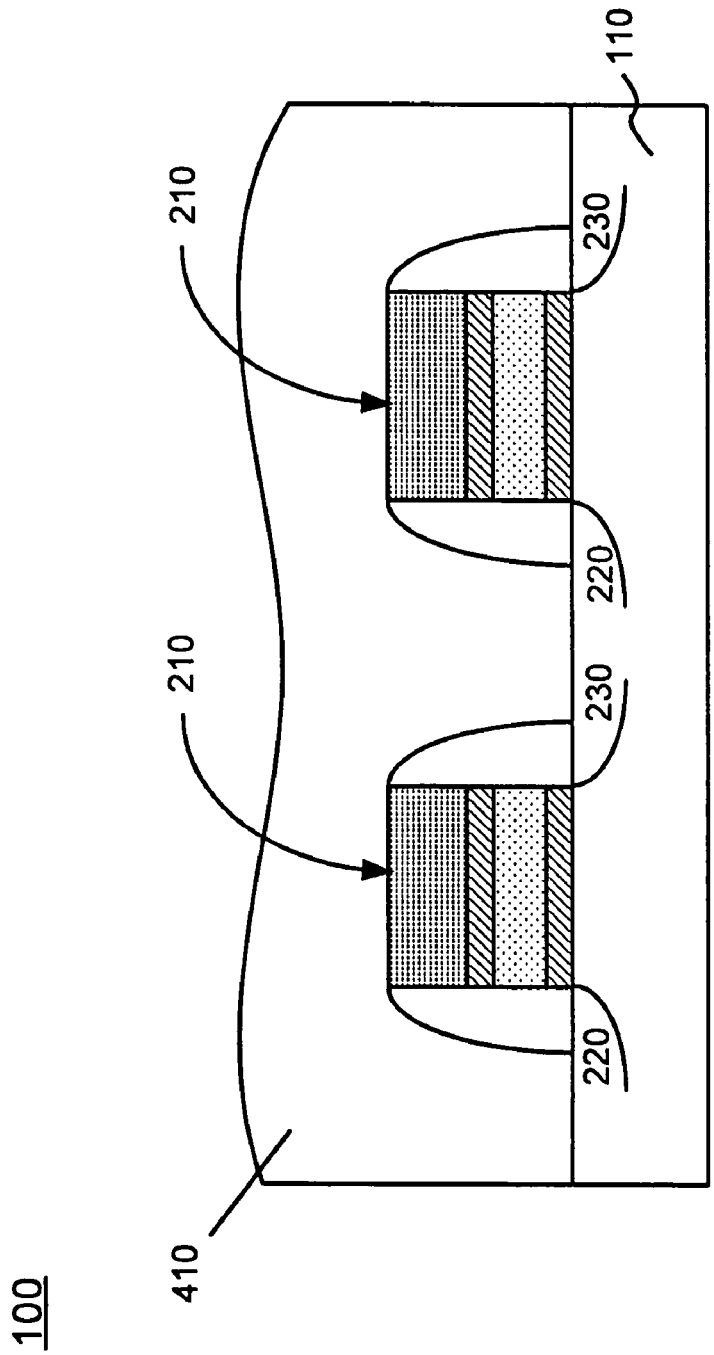
FIG. 4A is a cross-section illustrating the formation of an interlayer dielectric on the device of FIG. 3 in accordance with an embodiment of the invention.

A dielectric layer 410 may then be deposited over semiconductor device 100, as illustrated in FIG. 4A. Dielectric layer 410, also referred to as interlayer dielectric (ILD) 410, may have a thickness ranging from about 1,000 Å to about 11,000 Å and may act as an ILD for semiconductor device 100. ILD 410, may include, for example, a phoshphosilicate glass (PSG) material, a boro-phosphosilicate glass (BPSG) material, an oxide or some other dielectric material.

Figure 4B:
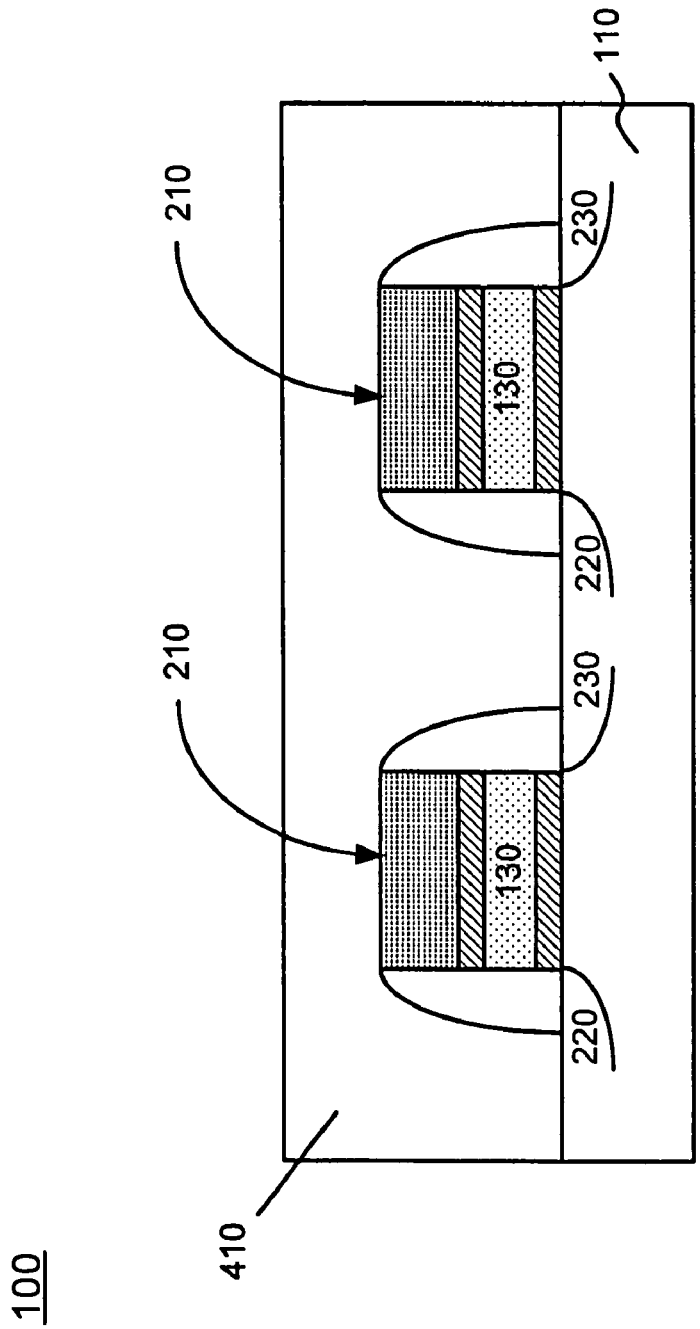
FIG. 4B is a cross-section illustrating the planarization of the interlayer dielectric of FIG. 4A in accordance with an embodiment of the invention.

ILD 410 may optionally be planarized using a conventional process, such as a chemical-mechanical polishing (CMP) process, as illustrated in FIG. 4B. Referring to FIG. 4B, the CMP process may planarize the top surface of ILD 410 to facilitate formation of subsequent structures, such as interconnect lines. ILD 410, consistent with the invention, may represent an ILD located closest to substrate 110. In alternative implementations, ILD 410 may represent an interlayer dielectric formed a number of layers above the surface of substrate 110. In each case, ILD 410 functions to isolate various conductive structures, such as various interconnect lines or to isolate source region 220 or drain region 230 from other conductive structures.

Figure 5A:
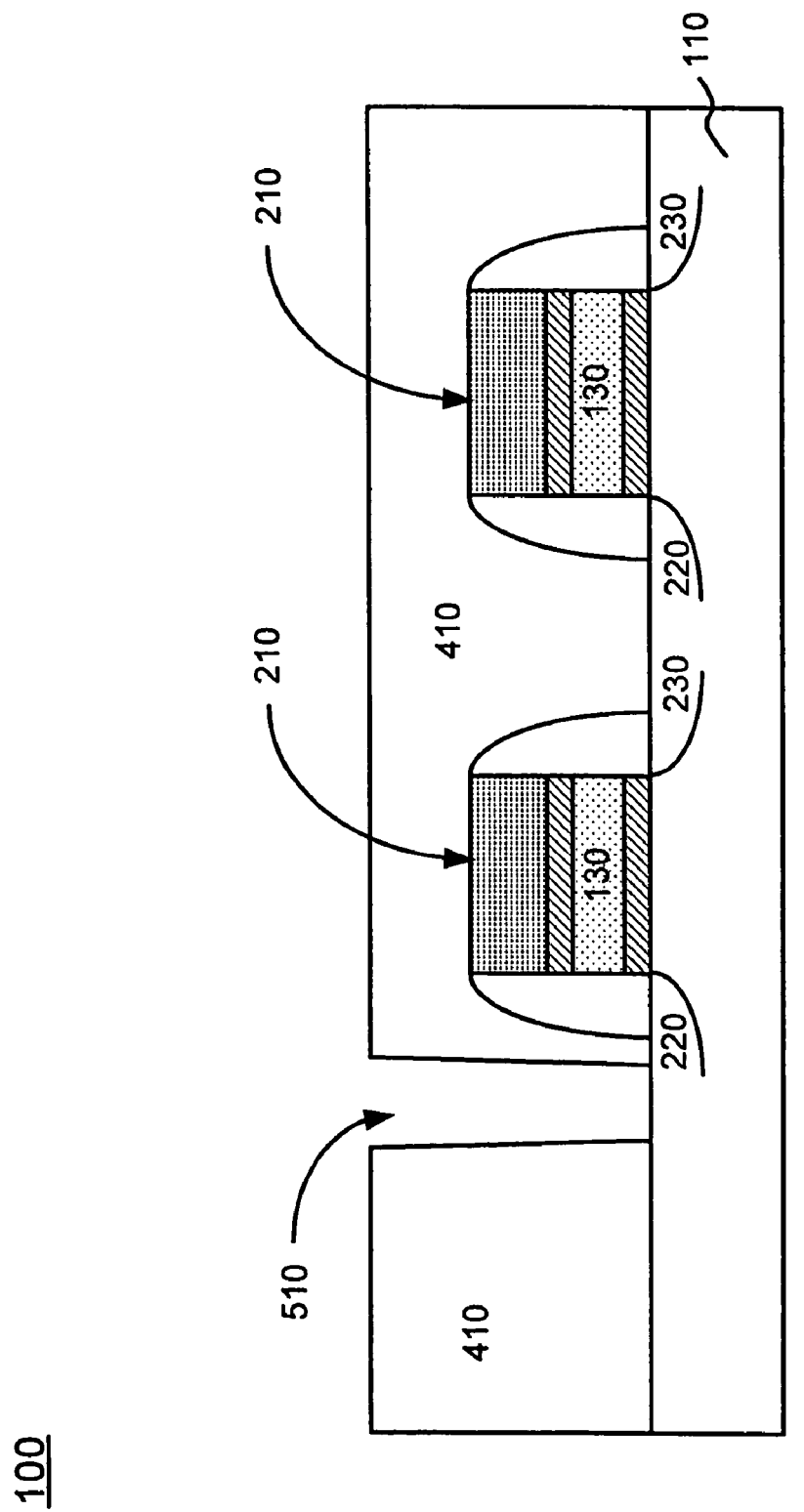
FIGS. 5A & 5B illustrate the formation of a via in the interlayer dielectric of FIG. 4B in accordance with an embodiment of the invention.
Figure 5B:
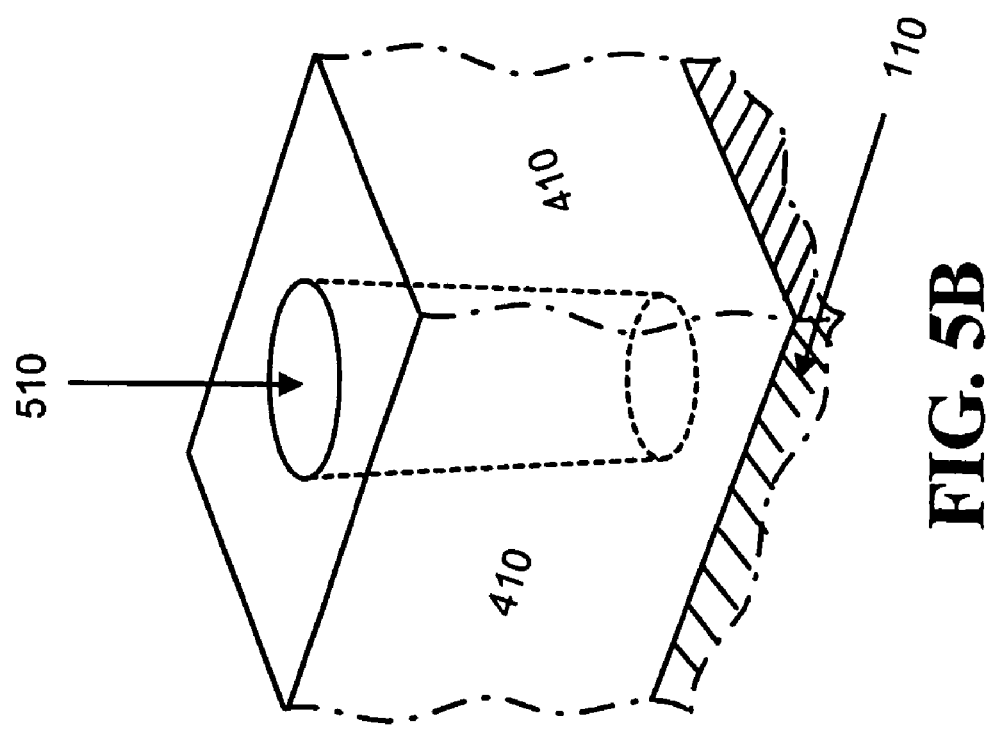

A via 510 may be formed in ILD 410 using conventional photolithographic and etching techniques, as illustrated in FIGS. 5A and 5B. In one implementation, via 510 may be used to form a contact to source region 220 or drain region 230. Via 510 may also be used to form a contact between semiconductor devices, or between conductors that interconnect various conductive structures in a single semiconductor device. The diameter of via 510 may range, for example, from about 200 Å to about 4,000 Å. In one exemplary embodiment, the diameter of via 510 may be approximately 800 Å. Via 510 is shown in FIG. 5B as having roughly a circular shape. In other implementations, via 510 may have other shapes, such as a rectangular cross-section when viewed from above.

Figure 6B:
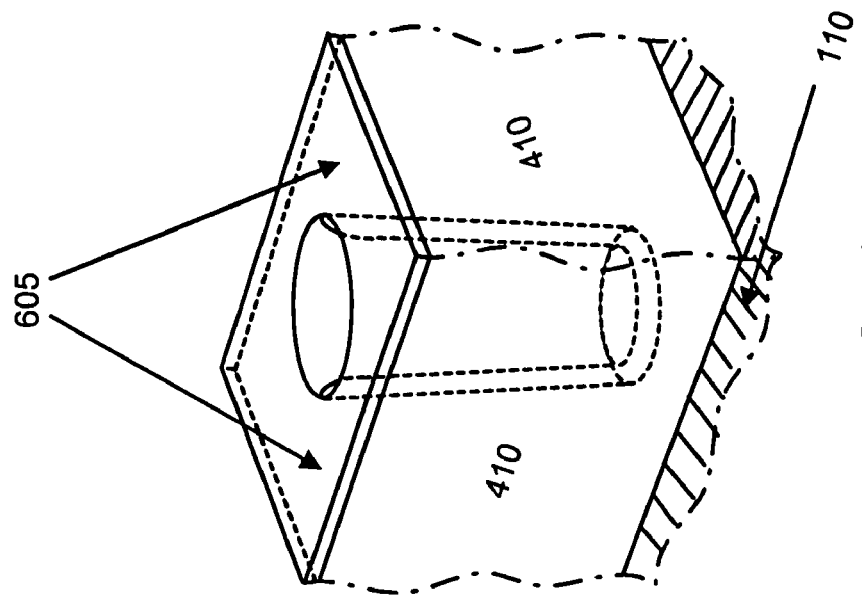
FIGS. 6A & 6B illustrate the formation of a conformal layer within the via of FIGS. 5A & 5B consistent with an aspect of the invention.
Figure 6A:
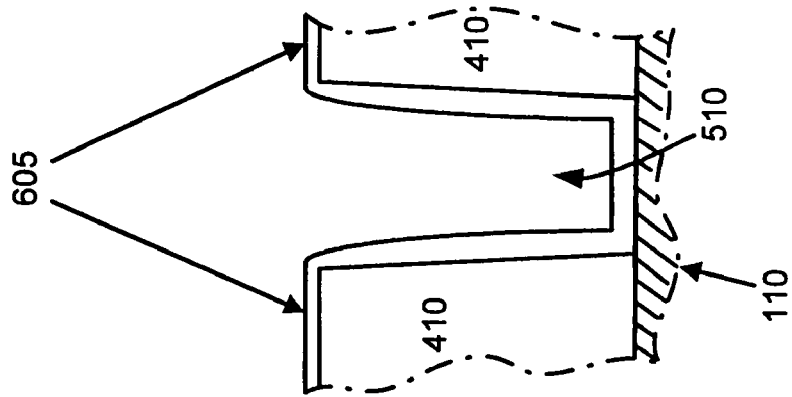

As shown in FIGS. 6A & 6B, a conformal layer 605 may be formed on the surfaces of via 510. Layer 605 may be formed using an atomic layer deposition (ALD) process. ALD includes a process by which atoms may be deposited on a substrate, one monolayer at a time, to grow a multi-layered thin film. In an ALD process, a first pre-cursor gas may be injected into a reactor in which semiconductor device 100, including via 510, has been placed. The first pre-cursor gas saturates a surface of via 510 to form a first monolayer. The reactor may then be purged with an inert gas. After the first pre-cursor gas is purged, a second pre-cursor gas may be injected into the reactor to form another monolayer over the first monolayer. The reactor may then again be purged with an inert gas. The gas injection and purging process may be selectively repeated until layer 605 is grown to a desired thickness.

Layer 605 may include a nitride material such as, for example, silicon nitride (SiN) or silicon oxide nitride (SiON) and have a thickness ranging, for example, from about 20 Å to about 500 Å. In one exemplary embodiment, the thickness of layer 605 may be approximately 200 Å and layer 605 may provide good conformality. That is, the thickness of layer 605 may be substantially equal on the sidewalls and bottom of via 510. Since the ALD process may be performed using a significantly lower temperature (e.g., approximately 500 degrees C.) than the temperature involved in a LPCVD process (e.g., approximately 760 degrees C.), "re-flow" of ILD layer 410 may be reduced, thus, resulting in less deformation of the contact. In one exemplary embodiment, the deposition temperature of layer 605 may be 400 degrees C.

Figure 7B:
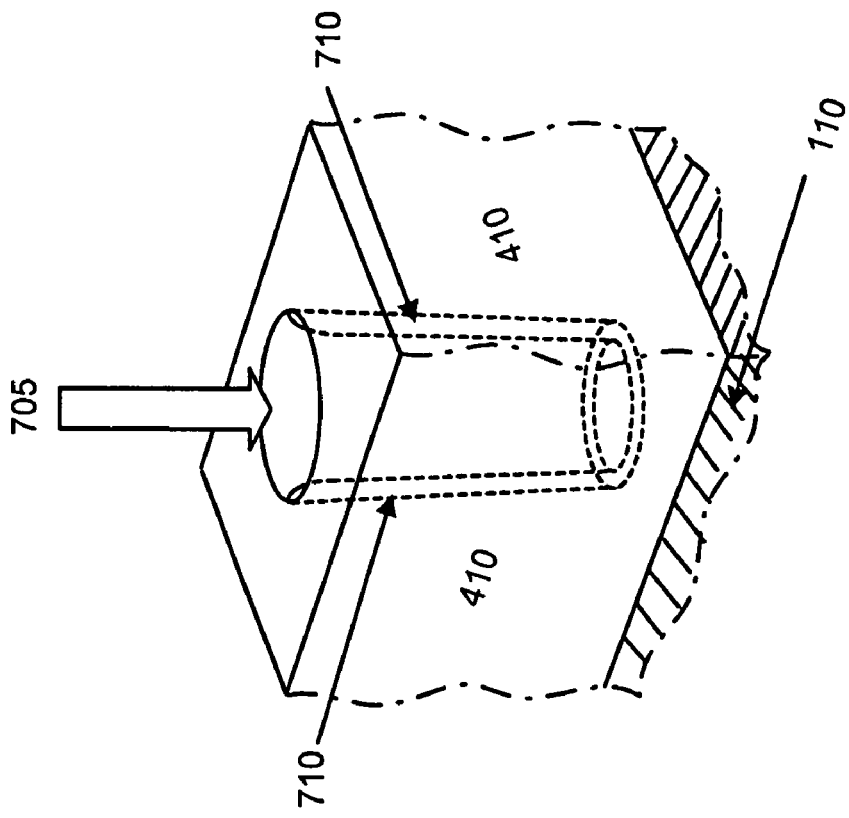
FIGS. 7A & 7B illustrate the formation of a spacer in the via of FIGS. 6A & 6B consistent with an aspect of the invention.
Figure 7A:
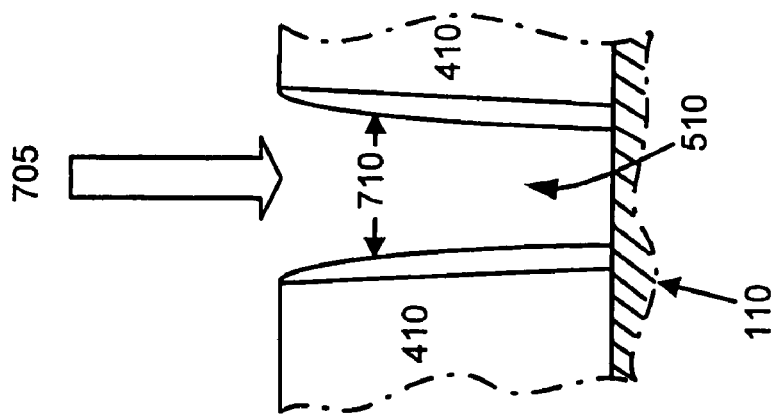

Portions of conformal layer 605 may then be removed, as shown in FIGS. 7A & 7B, using, for example, an existing etching process 705, to leave a spacer 710 on the sidewalls of via 510. During the etching 705, the portion of layer 605 in the bottom of via 510, and portions of layer 605 formed on top of ILD 410, may be etched away to create spacer 710.

A first barrier metal layer 805 may then be formed over spacer 710, as shown in FIGS. 8A and 8B. Layer 805 may be formed using, for example, existing deposition processes and may include, for example, titanium (Ti). The thickness of layer 805 may range, for example, from about 150 Å to about 300 Å. A second barrier metal layer 810 may be formed over layer 805. Layer 810 may be formed using, for example, existing deposition processes and may include, for example, TiN. The thickness of layer 810 may range, for example, from about 50 Å to about 200 Å. In one exemplary embodiment, the combined thickness of layers 805 and 810 may be approximately 300 Å. An annealing process may be performed to react the titanium with the underlying semiconducting material (e.g., silicon) in layer 110 to form a region 815 of titanium silicide, or an intermix of titanium and silicon, at the bottom of via 510.

Figure 9B:
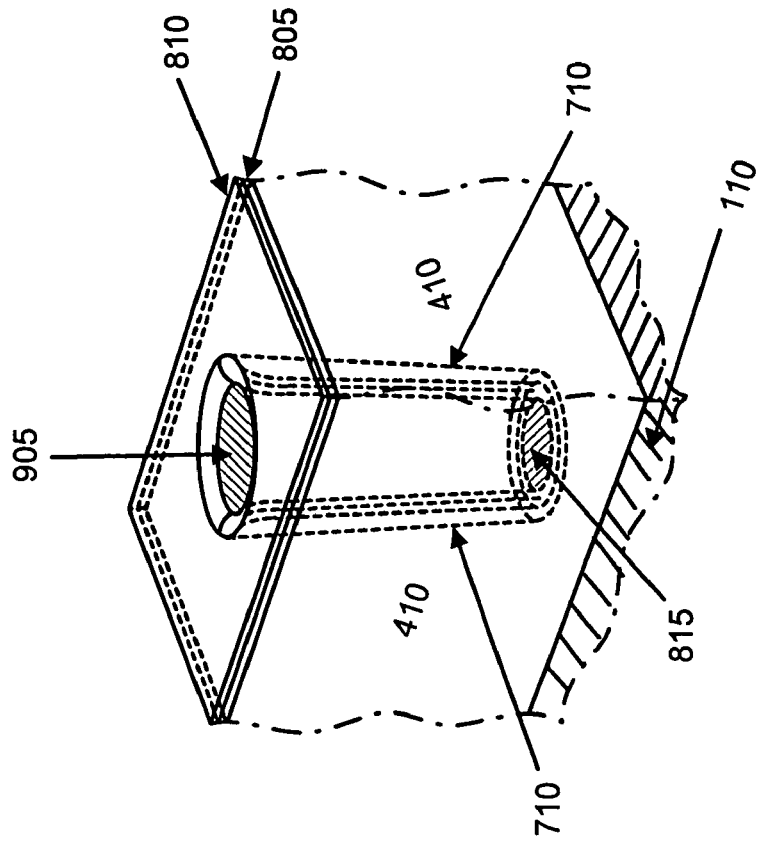
FIGS. 9A & 9B illustrate the formation of a contact over the metal layers within the via of FIGS. 8A & 8B consistent with an aspect of the invention.
Figure 9A:
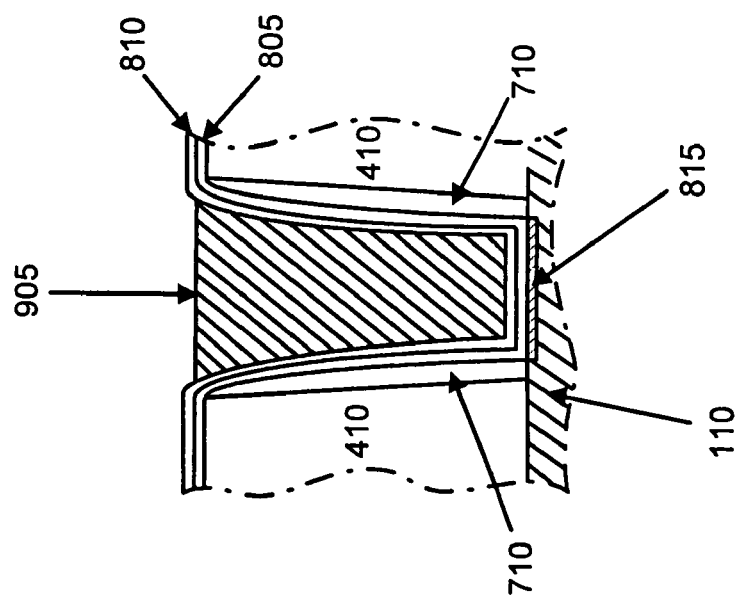

As shown in FIGS. 9A & 9B, a contact 905 may be formed over barrier metal layers 805 and 810 within via 510. Contact 905 may be formed using, for example, existing deposition processes. Contact 905 may include, for example, tungsten (W). Other existing contact materials, such as, for example, copper, aluminum, or titanium may be used. Contact 905 may be formed to substantially fill via 510.

Subsequent processing may be used to complete the formation of semiconductor device 100. For example, additional ILD layers and contacts may be formed, followed by formation of a cap layer at the upper surface of semiconductor device 100. In an exemplary implementation, each contact in semiconductor device 100 may be formed in a similar manner as that described above with respect to contact 905. This helps reduce contact deformation and also reduces leakage problems associated with memory cells 210.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A method of forming a contact, comprising:
   forming a via through a dielectric material;
   using atomic layer deposition (ALD) to form a silicon oxide nitride (SiON) spacer on sidewalls of the via;
   forming a barrier layer adjacent the spacer, where forming the barrier layer comprises:
   forming a layer of titanium adjacent the spacer to a thickness ranging from about 150 Å to about 300 Å, and
   forming a layer of titanium nitride adjacent the layer of titanium to a thickness ranging from about 50 Å to about 200 Å; and
   forming a contact adjacent the barrier layer.

2. The method of claim 1, wherein the SiON spacer has a thickness ranging from about 20 Å to about 500 Å.

3. The method of claim 1, wherein the ALD is performed at a temperature of 500 degrees or less.

4. The method of claim 1, wherein forming the contact comprises:
   depositing tungsten adjacent the baffler layer to substantially fill the via.

5. The method of claim 1, where forming the baffler layer further comprises:
   forming the layer of titanium and the layer of titanium nitride to a combined thickness of approximately 300 Å.

6. A method, comprising:
   forming a silicon oxide nitride (SiON) spacer within a via using atomic layer deposition (ALD); and
   forming a contact adjacent the spacer within the via.

7. The method of claim 6, wherein forming the SiON spacer comprises:
   depositing a layer of SiON material using ALD performed at a temperature of about 500 degrees C. or lower; and
   etching the SiON material to form the SiON spacer.

8. The method of claim 7, wherein the layer of SiON material has a thickness ranging from about 20 Å to about 500 Å.

9. The method of claim 6, further comprising:
   forming a barrier metal layer over the SiON spacer prior to forming the contact.

10. The method of claim 9, wherein the barrier metal layer includes a layer of titanium.

11. The method of claim 10, wherein the baffler metal layer further includes a layer of titanium nitride formed adjacent the layer of titanium.

12. The method of claim 11, where forming the barrier metal layer comprises:
    forming the layer of titanium to a thickness ranging from about 150 Å to about 300 Å; and
    forming the layer of titanium nitride to a thickness ranging from about 50 Å to about 200 Å.

13. The method of claim 12, where forming the barrier metal layer further comprises:
    forming the layer of titanium and the layer of titanium nitride to a combined thickness of approximately 300 Å.

14. The method of claim 9, wherein forming the contact comprises:
    forming the contact over the barrier metal layer.

15. The method of claim 9, wherein forming the contact comprises:
    depositing a metal adjacent the baffler metal layer to substantially fill the via.

16. A contact structure in a semiconductor device, comprising:
    a layer of dielectric material;
    a via formed through the dielectric material;
    a silicon oxide nitride (SiON) spacer formed on sidewalls of the via using atomic layer deposition (ALD);
    a baffler layer formed adjacent the spacer; and
    a metal formed adjacent the barrier layer.

17. The contact structure of claim 16, wherein the SiON spacer has a thickness ranging from about 20 Å to about 500 Å.

18. The contact structure of claim 16, wherein the baffler layer includes a layer of titanium.

19. The contact structure of claim 18, wherein the barrier layer further includes a layer of titanium nitride formed adjacent the layer of titanium.

20. The contact structure of claim 19, where the layer of titanium has a thickness ranging from about 150 Å to about 300 Å and where the layer of titanium nitride has a thickness ranging from about 50 Å to about 200 Å.

21. The contact structure of claim 20, where the layer of titanium and the layer of titanium nitride have a combined thickness of approximately 300 Å.

22. The contact structure of claim 16, wherein the metal substantially fills the via and comprises tungsten.

* * * * *